(12) United States Patent
Haensch et al.

(10) Patent No.: US 7,132,323 B2
(45) Date of Patent: Nov. 7, 2006

(54) CMOS WELL STRUCTURE AND METHOD OF FORMING THE SAME

(75) Inventors: Wilfried Haensch, Somers, NY (US); Terence B. Hook, Jericho Center, VT (US); Louis C. Hsu, Fishkill, NY (US); Rajiv V. Joshi, Yorktown Heights, NY (US); Werner Rausch, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 127 days.

(21) Appl. No.: 10/713,447

(22) Filed: Nov. 14, 2003

(65) Prior Publication Data

US 2005/0106800 A1 May 19, 2005

(51) Int. Cl.
*H01L 21/8238* (2006.01)
(52) U.S. Cl. .................. 438/224; 438/222; 438/224; 438/202; 438/227; 438/228
(58) Field of Classification Search ................ 438/199, 438/201–202, 208, 301, 223–224, 227–228, 438/637, 700, 621, 689, 222, 422, 203, 694, 438/207
See application file for complete search history.

(56) References Cited

U.S. PATENT DOCUMENTS

| | | | | |
|---|---|---|---|---|
| 6,004,861 A | * | 12/1999 | Gardner et al. | 438/414 |
| 6,323,103 B1 | * | 11/2001 | Rengarajan et al. | 438/424 |
| 6,342,413 B1 | * | 1/2002 | Masuoka et al. | 438/197 |
| 6,482,717 B1 | * | 11/2002 | Hahn | 438/429 |
| 6,864,128 B1 | * | 3/2005 | Nishida et al. | 438/153 |

* cited by examiner

*Primary Examiner*—M. Wilezewski
*Assistant Examiner*—Thanh Y. Tran
(74) *Attorney, Agent, or Firm*—F. Chau & Associates LLC

(57) ABSTRACT

A method for forming a CMOS well structure including forming a plurality of first conductivity type wells over a substrate, each of the plurality of first conductivity type wells formed in a respective opening in a first mask. A cap is formed over each of the first conductivity type wells, and the first mask is removed. Sidewall spacers are formed on sidewalls of each of the first conductivity type wells. A plurality of second conductivity type wells are formed, each of the plurality of second conductivity type wells are formed between respective first conductivity type wells. A plurality of shallow trench isolations are formed between the first conductivity type wells and second conductive type wells. The plurality of first conductivity type wells are formed by a first selective epitaxial growth process, and the plurality of second conductivity type wells are formed by a second selective epitaxial growth process.

25 Claims, 7 Drawing Sheets

CMOS WELL STRUCTURE AND METHOD OF FORMING THE SAME

BACKGROUND OF THE INVENTION

1. Field of the Invention

The present invention relates to semiconductor devices, and more particularly to integrated semiconductor devices, such as complementary metal oxide semiconductor (CMOS) devices.

2. Description of the Related Art

In CMOS integration, i.e. NMOS and PMOS on the same chip, at least one well is needed on a silicon substrate. For example, when using a p-type substrate, NMOS can be fabricated on the substrate, while PMOS must be fabricated on an n-well in the substrate. Alternatively, when using an n-type substrate, PMOS can be fabricated on the substrate, while NMOS must be fabricated on a p-well in the substrate. Further, in order to avoid problems associated with latch-up, a dual-well approach is usually employed. The dual-well approach involves forming NMOS on a p-well and PMOS on an n-well, regardless of the type of starting substrate. The dopant concentrations of both wells are tailored so that the latch-up situation does not occur.

In order to completely isolate both wells from the starting substrate, one extra well is often employed. This is called the "triple-well" structure. In this case, for example, when an n-well is formed in an n-type substrate, unless the bottom and the surrounding of the n-well is sealed by p-dopant material, it is not possible to isolate the n-well and bias it differently from the substrate. One common example is the formation of a DRAM array having NMOS transfer gates on a p-doped silicon substrate. Without using a triple-well structure, the DRAM array can not be biased with a voltage which is different from ground. A negative bias "Vbb" is generally applied to the buried well so that charge retention can be preserved. Triple well structures are also desirable for placing analog devices which either generate either a high level of noise, or demand a very quiet environment, and are also applicable to devices or circuits which require a separate body bias.

A great challenge in well formation has been experienced as CMOS technology is scaled beyond deep sub-micron and into the nanometer groundrule regime. As devices are getting smaller, the ground rules such as well-to-well and device-to-well dimensions are also expected to scale accordingly. However, the same scaling factors which apply to the transistor may not apply to conventional wells which are formed by ion implantation. One problem associated with using ion implantation to form wells is the well proximity effect, wherein the doping profile at the edges of a well is not uniform across the breadth of the well. This phenomenon is due to ion scattering from high energy, high dose ion implantation. As a result, devices that are disposed closer to the edges of a well have a different threshold voltage Vt than devices disposed away from the edges of the well. One simple solution to this problem is to keep devices away from the edges of the wells. However, this approach is not suitbale in a 6-T SRAM array where memory cells must be closely packed. Specifically, keeping devices away from the edges of wells obviously wastes chip space, and if the resultant threshold voltage is unacceptable to the SRAM cell, then an additional mask must be added to the process to properly center the threshold voltage, resulting in additional cost and complexity.

SUMMARY OF THE INVENTION

An object of the invention is to enable well scalability, so that well-to-well and device-to-well dimensions can be scaled according to technology ground rules.

Another object of the invention is to completely isolate different conductivity type wells by using both deep and shallow trench isolation.

Another object of the invention is to form a multiple and isolated well structure on a bulk substrate using a fully self-aligned, low temperature epitaxial growth process.

A method for forming a CMOS well structure according to the invention incudes forming a first mask on a substrate, the first mask having a plurality of openings. A plurality of first conductivity type wells are formed over the substrate, each of the plurality of first conductivity type wells formed in a respective opening in the first mask. A cap is formed over each of the first conductivity type wells, and the first mask is removed. Sidewall spacers are formed on sidewalls of each of the first conductivity type wells. A plurality of second conductivity type wells are formed, each of the plurality of second conductivity type wells are formed between respective first conductivity type wells. A plurality of shallow trench isolations are formed between the first conductivity type wells and second conductive type wells. At least one second conductivity type MOS device is formed inside each of the plurality of first conductivity type wells, and at least one first conductivity type MOS device is formed inside each of the plurality of second conductivity type wells.

In at least one embodiment of the invention, the plurality of first conductivity type wells are formed by a first selective epitaxial growth process, and the plurality of second conductivity type wells are formed by a second selective epitaxial growth process.

At least one embodiment of the invention includes etching the substrate between the plurality of openings in the first mask to a predetermined depth before forming a plurality of first conductivity type wells over the substrate. A plurality of first conductivity type implant regions are formed in the substrate before the step of forming sidewall spacers, each of the plurality of first conductivity type implant regions formed in a respective exposed surface of the substrate. The plurality of first conductivity type wells are formed by a first selective epitaxial growth process, and the plurality of second conductivity type wells are formed by a second selective epitaxial growth process over exposed surfaces of the first conductivity type implant regions.

These and other objects and features of the present invention will become apparent from the following detailed description of illustrative embodiments thereof, which is to be read in connection with the accompanying drawings.

BRIEF DESCRIPTION OF DRAWINGS

The invention will be described in detail in the following description of preferred embodiments with reference to the following figures wherein.

DESCRIPTION OF PREFERRED EMBODIMENTS

In various exemplary embodiments of the invention, a vertical sidewall well is formed in a bulk silicon wafer. Consecutive low-temperature selective epitaxy processes are used to form the vertical sidewall single well, double well and triple well structures, so that proximity effect due to ion scattering is eliminated. In the absence of the proximity effect, minimum distance can be kept between devices all the way to the well boundary. The various exemplary embodiments of the invention use both deep and shallow trench isolation. Spacer-type thin vertical deep trenches are formed at the boundary of the wells using side-wall spacer techniques, while the shallow trenches are used not only to isolate the devices within the wells, but also to remove defects at the well boundary caused by selective epitaxy.

Figure 1:
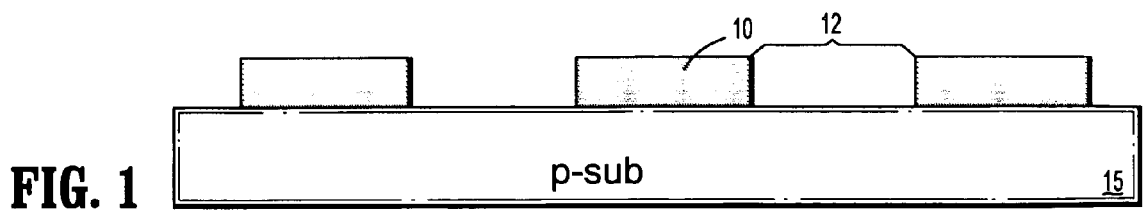
FIGS. 1–11 are cross sectional views showing various steps of a method for forming a CMOS structure according to an embodiment of the invention.

FIGS. 1–11 are cross sectional views showing various steps of a method for forming a CMOS structure according to an exemplary embodiment of the invention. The present embodiment forms a CMOS dual well structure. As shown in FIG. 1, an n-well mask 10 is formed over a p-type substrate 15. The n-well mask 10 has a plurality of openings 12 that expose the upper surface of the p-type substrate 15. The mask 10 is formed by depositing a mask layer over the p-type substrate 15 and patterning the mask layer. The mask 10 can be made of any suitable material, such as, for example, polysilicon, silicon dioxide ($SiO_2$) or silicon nitride (SiN). The first mask is preferably formed to a thickness of about 50 nm to about 500 nm.

Figure 2:
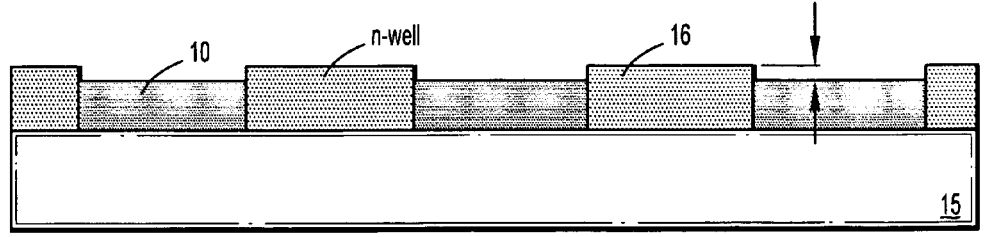

As shown in FIG. 2, n-well regions 16 are formed over the p-type substrate 15 within the openings 12 of the n-well mask 10. The n-well regions 16 are formed by an n-type selective epitaxial growth process. The n-well regions 16 are in-situ doped with an n-type dopant having a concentration of about $1\times10^{17}/cm^3$ to about $1\times10^{20}/cm^3$. The n-well regions 16 are preferably formed with a certain amount of overgrowth f above the mask 10 to avoid corner faceting.

Figure 3:
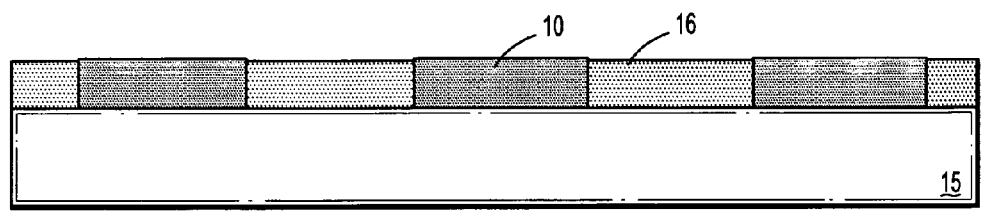

As shown in FIG. 3, the upper surface of the n-well regions 16 are planarized and epitaxial overgrowth material is removed. This step can be carried out using any suitable polishing process, such as a chemical mechanical polishing process (CMP).

Figure 4:
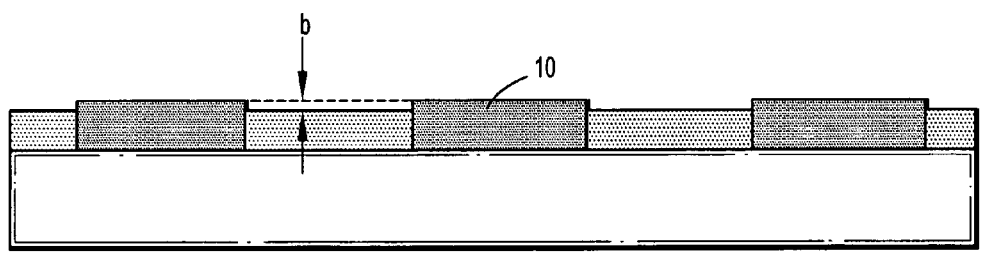

As shown in FIG. 4, upper portions of the n-well regions 16 are recessed back to a predetermined depth b. In this step, the n-well regions 16 are subjected to an etching process, such as, for example, a wet etching process.

Figure 5:
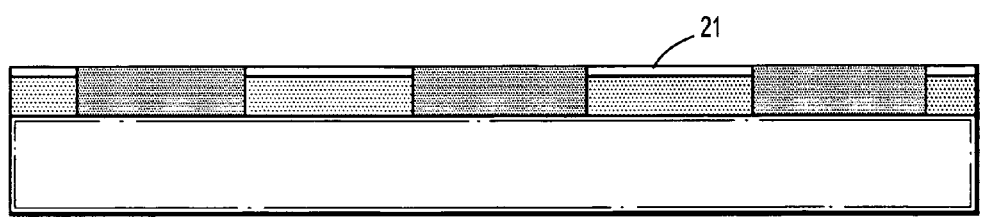
Figure 6:
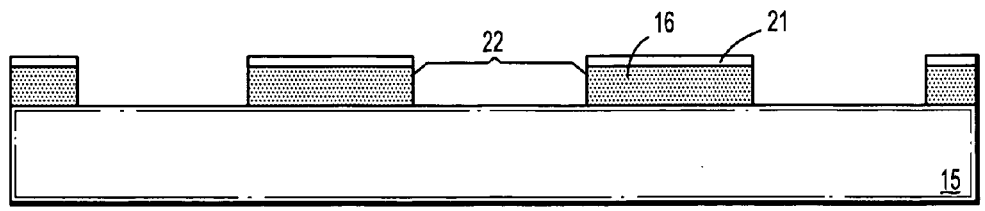

As shown in FIG. 5, the n-well regions 16 are covered with caps 21. The caps 21 can be formed by any suitable process, such as, for example, chemical vapor deposition (CVD) or thermal oxidation. The caps 21 can be made of, for example, silicon dioxide. The first mask 10 is removed by, for example, nitride wet etching, to achieve the structure shown in FIG. 6.

Figure 7:
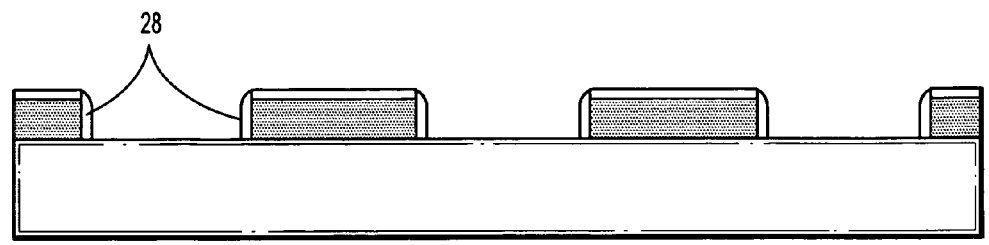

As shown in FIG. 7, spacers 28 are formed on the vertical side walls of the n-well regions 16. The spacers 28 can be formed by a CVD process in which nitride is deposited to a thickness in the range of about 5 to 30 nm. The spacers 28 seal the sidewalls of the n-well regions 16 to avoid out-diffusion or cross-contamination.

Figure 8:
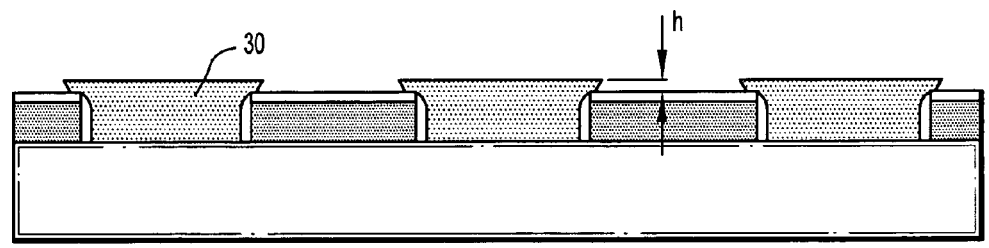

As shown in FIG. 8, p-well regions 30 are formed over substrate 15 between the n-well regions 16. The p-well regions 30 are formed by a p-type selective epitaxial growth process with an in-situ doping concentration in the range of about $1\times10^{17}/cm^3$ to about $1\times10^{20}/cm^3$. The p-well regions 30 are preferably formed with a certain amount of overgrowth h above the caps 21 to avoid corner faceting.

Figure 9:
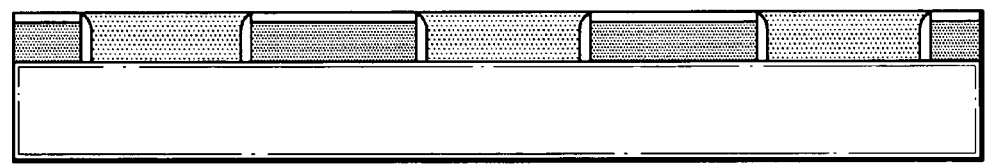

As shown in FIG. 9, the upper surface of the p-well regions 30 are planarized and epitaxial overgrowth material is removed. This step can be carried out using any suitable polishing process, such as a chemical mechanical polishing process (CMP).

Figure 10:
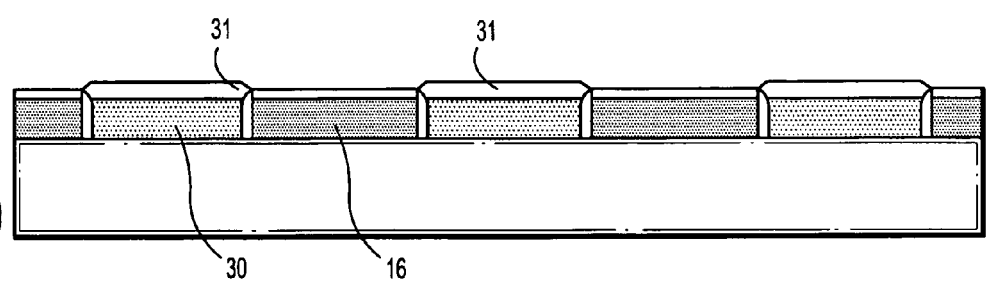

As shown in FIG. 10, the p-well regions 30 are covered with caps 31. The caps 31 can be formed by any suitable process, such as, for example, chemical vapor deposition (CVD) or thermal oxidation. The caps 31 can be made of, for example, silicon dioxide.

Figure 11:
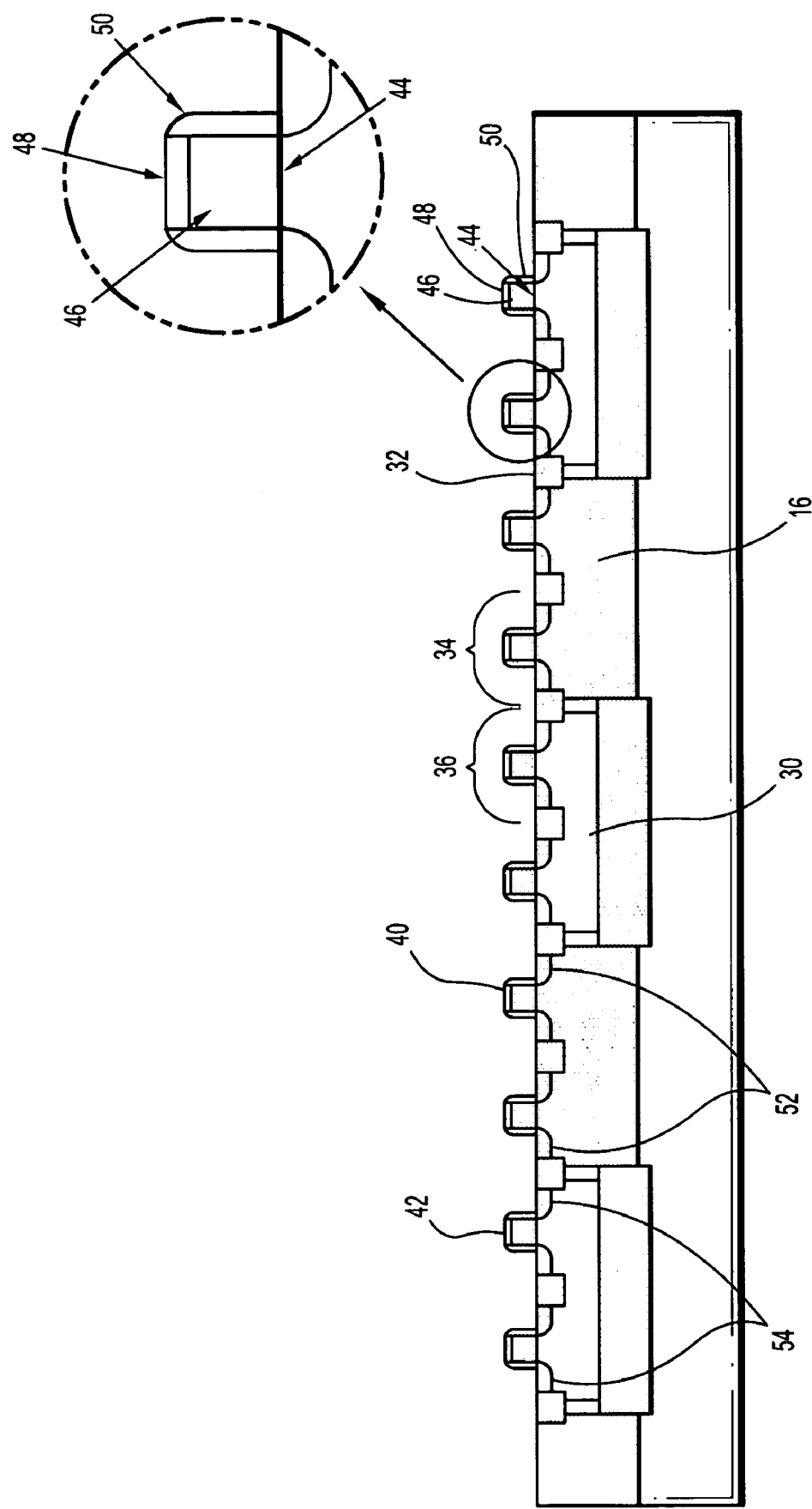

As shown in FIG. 11, Shallow Trench Isolations (STIs) 32 are formed for device isolation and well boundary formation. The STIs 32 are formed using standard shallow trench process steps that are well known to those skilled in the art. The STIs 32 isolate device regions 34 in the n-well regions 16 and device regions 36 in the p-well regions 30.

In various exemplary embodiments of the invention, different types of semiconductor devices can be formed in the device regions 34 and 36. In at least one embodiment of the invention, PMOS devices 40 are formed in the n-well device regions 16 and nMOS devices 42 are formed in the p-well device regions 36 using standard CMOS processing steps that are well known to those skilled in the art. Each MOS device 40 and 42 includes a gate dielectric 44, a gate conductor 46, an optional hard mask 48 formed on top of the gate conductors 46, and spacers 50 formed on at least the side walls of the gate conductors 46. P+ junctions 52 are formed in the n-well device regions 16 for the pMOS devices 40 and n+ junctions 54 are formed in the p-well device regions 36 for the nMOS devices 42.

Figure 12:
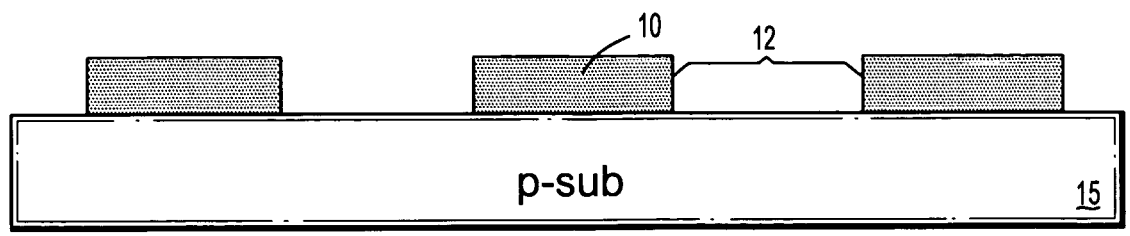
FIGS. 12–24 are cross sectional views showing various steps of a method for forming a CMOS structure according to another embodiment of the invention.

FIGS. 12–24 are cross sectional views showing various steps of a method for forming a CMOS structure according to another exemplary embodiment of the invention. The present embodiment of the invention forms a CMOS triple well structure. As shown in FIG. 12, an n-well mask 10 is formed over a p-type substrate 15. The n-well mask 10 has a plurality of openings 12 that expose the upper surface of the p-type substrate 15. The mask 10 is formed by depositing a mask layer over the p-type substrate 15 and patterning the mask layer. The mask 10 can be made of any suitable material, such as, for example, photoresist, polysilicon, silicon dioxide (SiO2) or silicon nitride (SiN).

Figure 13:
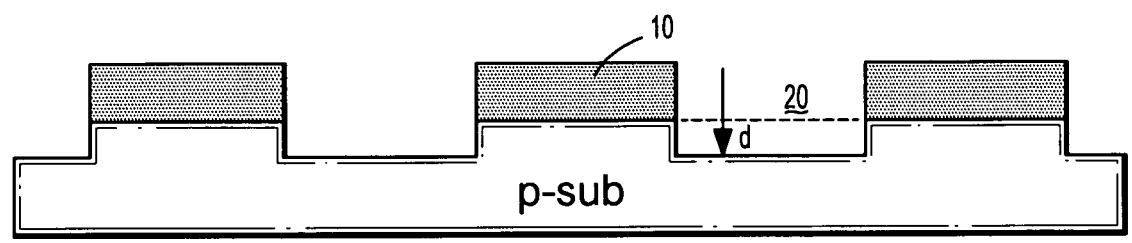

As shown in FIG. 13, portions of the p-type substrate 15 exposed by the openings 12 in the n-well mask 10 are etched to form openings 20 having a depth d in the p-type substrate 15. The depth d is preferably in the range of about 20 nm to about 500 nm. The p-type substrate 15 is preferably anisotropically etched using a $Cl_2$ based RIE (Reactive Ion Etching) process. In order to avoid damage to the substrate 15, low-powered plasma should be used in the etching process, followed by an annealing or cleaning step.

Figure 14:
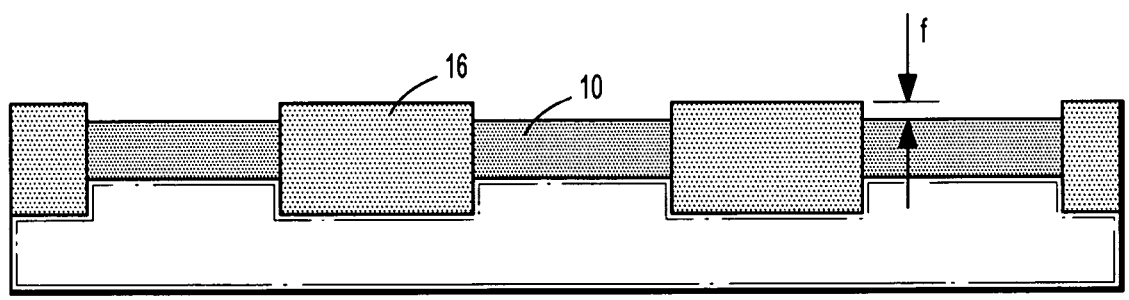

As shown in FIG. 14, n-well regions 16 are formed over the openings 20 in the p-type substrate 15. The n-well regions 16 are formed by an n-type selective epitaxial growth process. The n-well regions 16 are preferably formed with a certain amount of overgrowth f above the mask 10 to avoid corner faceting.

Figure 15:
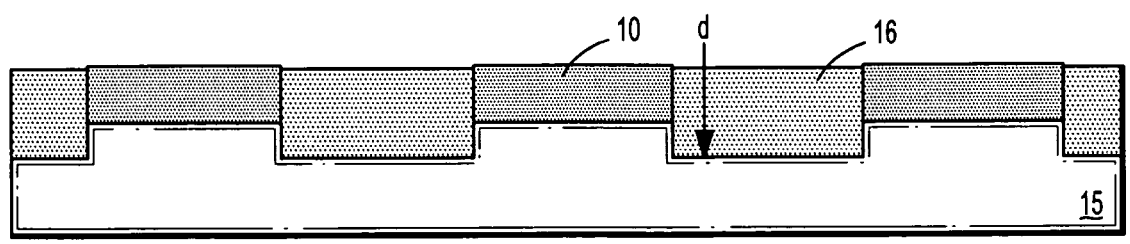

As shown in FIG. 15, the upper surface of the n-well regions 16 are planarized and epitaxial overgrowth material is removed. This step can be carried out using any suitable polishing process, such as a chemical mechanical polishing process (CMP).

Figure 16:
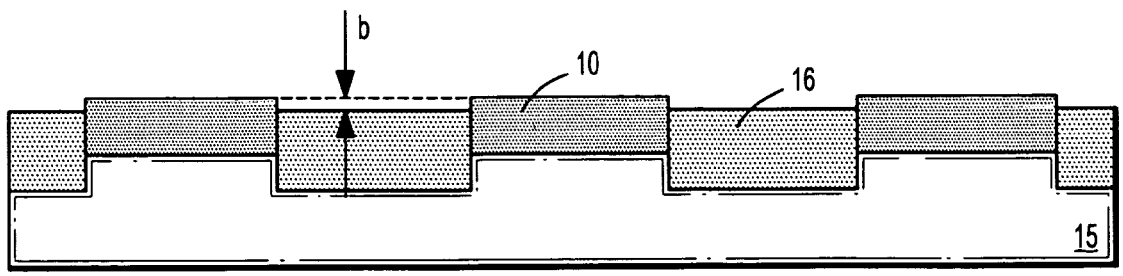

As shown in FIG. 16, upper portions of the n-well regions 16 are removed to a predetermined depth b. In this step, the n-well regions 16 are subjected to an etching process, such as, for example, a wet etching process.

Figure 17:
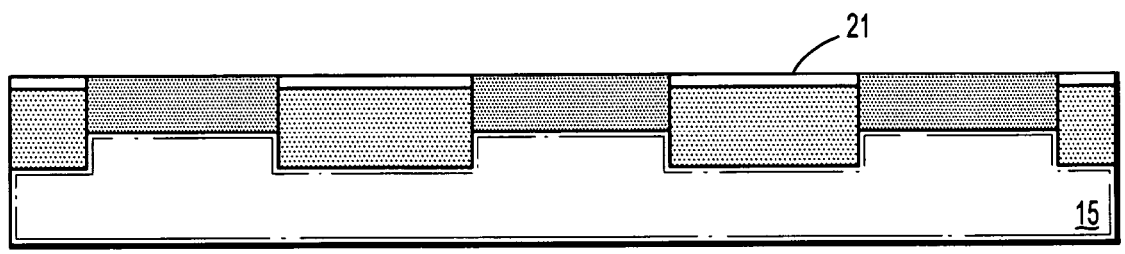
Figure 18:
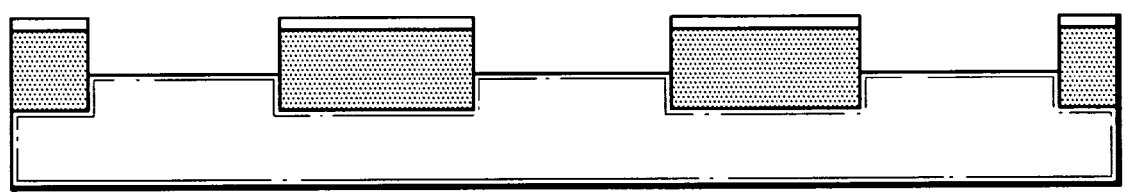

As shown in FIG. 17, the n-well regions 16 are covered with caps 21. The caps 21 can be formed by any suitable process, such as, for example, chemical vapor deposition (CVD) or thermal oxidation. The caps 21 can be made of, for example, silicon dioxide. The first mask 10 is removed by, for example, nitride wet etching, to achieve the structure shown in FIG. 18.

Figure 19:
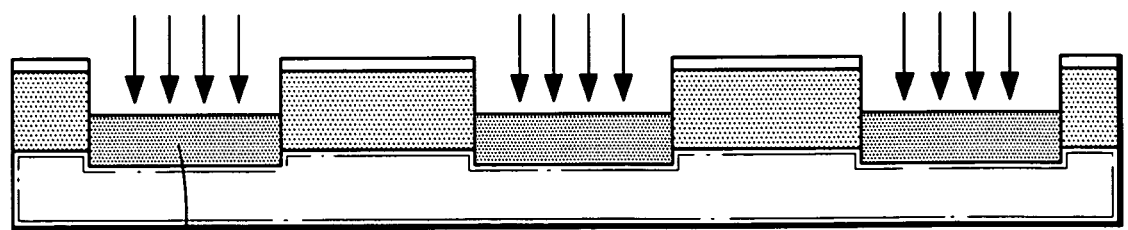

As shown in FIG. 19, n+ implant regions 26 are formed in the substrate 15 between the n-well regions 16. The n+implant regions 26 are formed by any known technique, such as, for example, ion implantation. The surface implantation doping concentration is preferably in the range of about $1 \times 10^{19}/cm^3$ to about $1 \times 10^{21}/cm^3$. After annealing, the final buried n+ implant regions 26 have a thickness of about 20 nm to about 600 nm.

Figure 20:
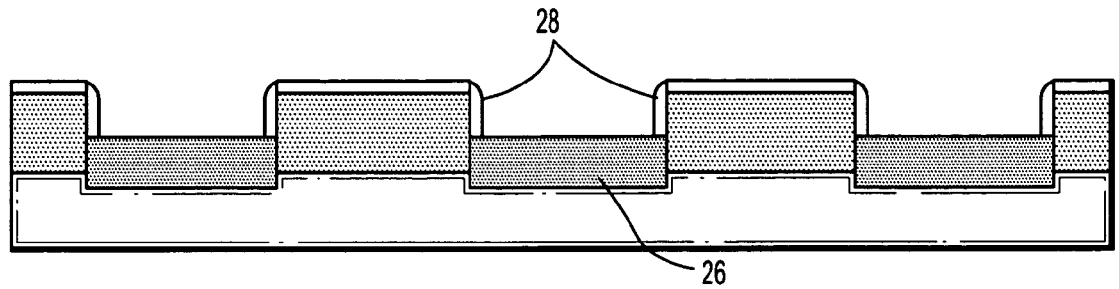

As shown in FIG. 20, spacers 28 are formed on the vertical side walls of the n-well regions 16. The spacers 28 are can be formed by a CVD process in which nitride is deposited to a thickness in the range of about 5 to 30 nm. The spacers 28 seal the sidewalls of the n-well regions 16 to avoid out-diffusion or cross-contamination.

Figure 21:
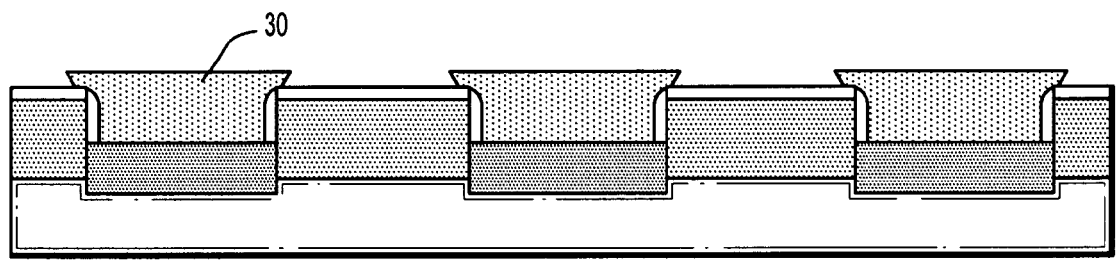

As shown in FIG. 21, p-well regions 30 are formed over substrate 15 between the n-well regions 16. The p-well regions 30 are formed by a p-type selective epitaxial growth process with a doping concentration in the range of about $1 \times 10^{17}/cm^3$ to $1 \times 10^{20}/cm^3$. The p-well regions 30 are preferably formed with a certain amount of overgrowth above the caps 21 to avoid corner faceting.

Figure 22:
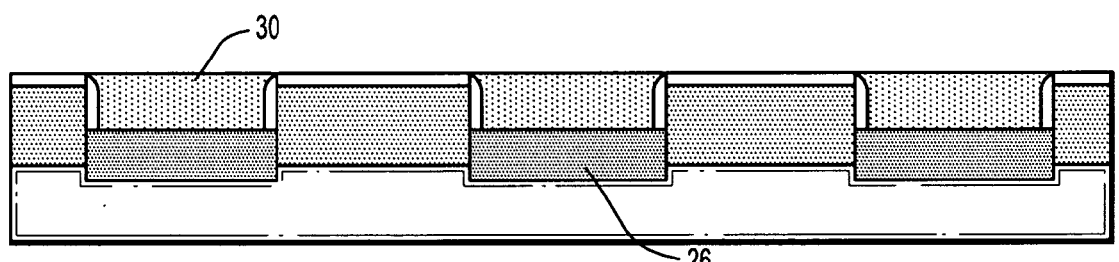

As shown in FIG. 22, the upper surface of the p-well regions 30 are planarized and epitaxial overgrowth material is removed. This step can be carried out using any suitable polishing process, such as a chemical mechanical polishing process (CMP).

Figure 23:
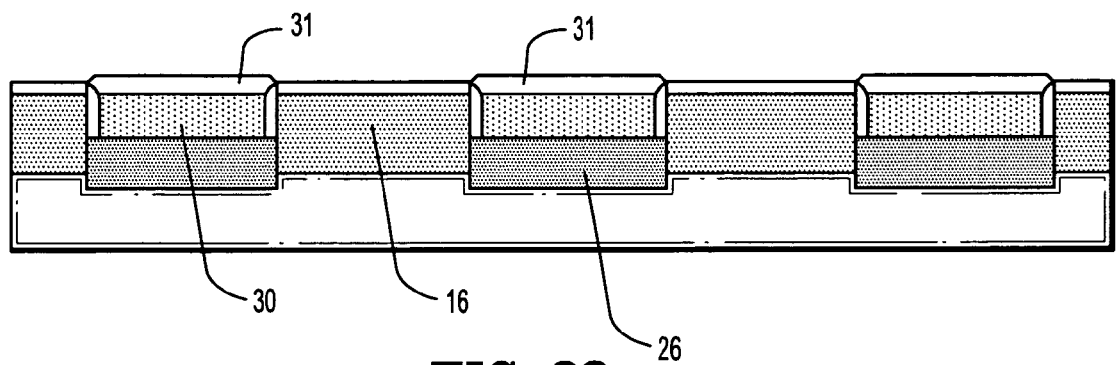

As shown in FIG. 23, the p-well regions 30 are covered with caps 31. The caps 31 can be formed by any suitable process, such as, for example, chemical vapor deposition (CVD) or thermal oxidation. The caps 31 can be made of, for example, silicon dioxide.

Figure 24:
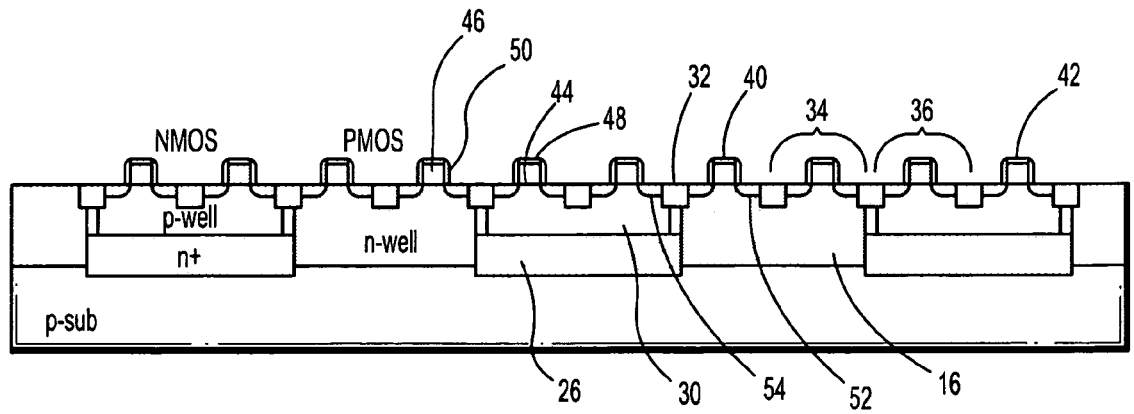

As shown in FIG. 24, Shallow Trench Isolations (STIs) 32 are formed for device isolation and well boundary formation. The STIs 32 are formed using standard shallow trench process steps that are well known to those skilled in the art. The STIs 32 isolate device regions 34 in the n-well regions 16 and device regions 36 in the p-well regions 30.

In various exemplary embodiments of the invention, different types of semiconductor devices can be formed in the device regions 34 and 36. In at least one embodiment of the invention, pMOS devices 40 are formed in the n-well device regions 16 and nMOS devices 42 are formed in the p-well device regions 36 using standard CMOS processing steps that are well known to those skilled in the art. Each MOS device 40 and 42 includes a gate dielectric 44, a gate conductor 46, an optional hard mask 48 formed on top of the gate conductors 46, and spacers 50 formed on at least the side walls of the gate conductors 46. P+ junctions 52 are formed in the n-well device regions 16 for the PMOS devices 40 and n+ 54 junctions are formed in the p-well device regions 36 for the nMOS devices 42.

Figure 25:
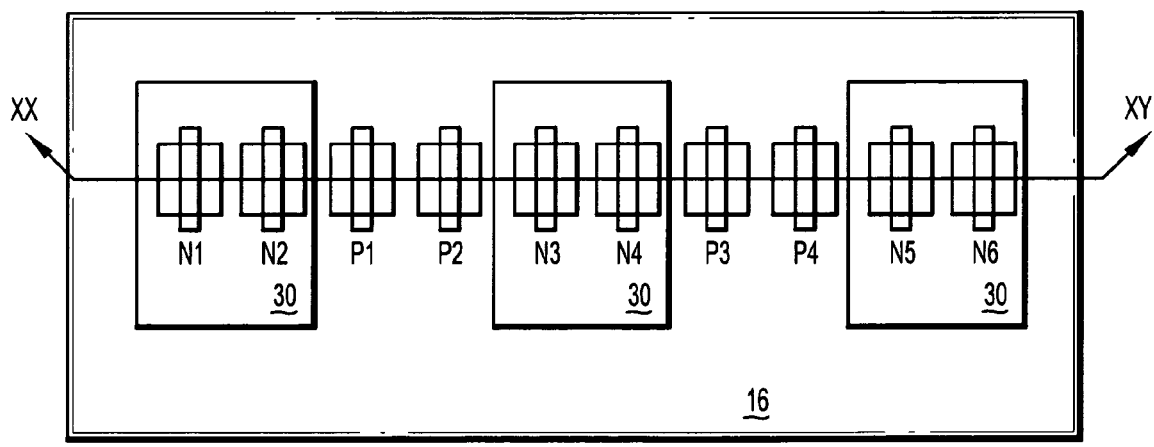
FIG. 25 is a cross sectional view of a CMOS structure according to an embodiment of the invention.
Figure 25:
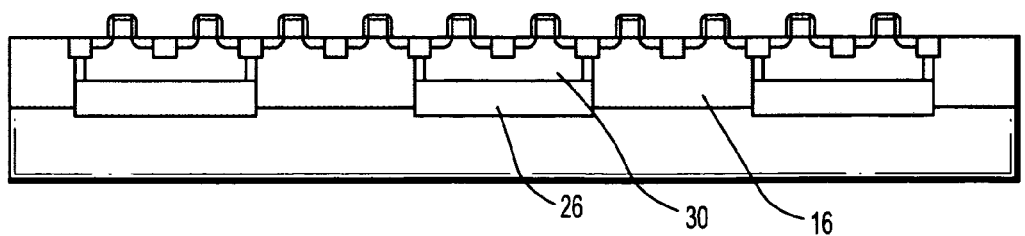

In other embodiments of the invention, at least one of the plurality of first conductivity type wells is a dummy first conductivity well that terminates at least one second conductivity type well. For example, FIG. 25 is a cross sectional view of a CMOS structure according to an embodiment of the invention. In this embodiment, a dummy n-well region 16A is formed at an edge of a p-well region 30 to isolate the p-well region 30. In other embodiments, a dummy p-well region (not shown) can be formed at an edge of an n-well region to isolate the n-well region.

Although the illustrative embodiments have been described herein with reference to the accompanying drawings, it is to be understood that the present invention and method are not limited to those precise embodiments, and that various other changes and modifications may be affected therein by one of ordinary skill in the related art without departing from the scope or spirit of the invention. All such changes and modifications are intended to be included within the scope of the invention as defined by the appended claims.

What is claimed is:

1. A method for forming a CMOS well structure, comprising:
   forming a first mask on a substrate, the first mask having a plurality of openings;
   forming a plurality of first conductivity type wells over the substrate, each of the plurality of first conductivity type wells being formed by filling respective openings in the first mask with a first conductivity type material;
   forming a cap over each of the first conductivity type wells;
   removing the first mask;
   forming sidewall spacers on sidewalls of each of the first conductivity type wells; and
   forming a plurality of second conductivity type wells over the substrates, each of the plurality of second conductivity type wells being formed by filling spaces between respective first conductivity type wells with second conductivity type material.

2. The method of claim 1, further comprising:
   forming a plurality of shallow trench isolations between the first conductivity type wells and second conductive type wells;
   forming at least one second conductivity type MOS device inside each of the plurality of first conductivity type wells; and
   forming at least one first conductivity type MOS device inside each of the plurality of second conductivity type wells.

3. The method of claim 1, wherein the plurality of first conductivity type wells are formed by a first selective epitaxial growth process, and the plurality of second conductivity type wells are formed by a second selective epitaxial growth process.

4. The method of claim 1, wherein the first mask is a low-temperature chemical vapor deposition nitride.

5. The method of claim 1, wherein the thickness of the first mask is in the range of about 50 nm to about 500 nm.

6. The method of claim 3, wherein the step of forming a plurality of first conductivity type wells comprises forming a first epitaxial layer in-situ doped with a first conductivity dopant.

7. The method of claim 6, wherein the doping concentration of the first conductivity dopant is in the range of about $1 \times 10^{17}/cm^3$ to about $1 \times 10^{20}/cm^3$.

8. The method of claim 6, further comprising:
   forming the first epitaxial layer to a larger thickness than that of the first mask to avoid epitaxial faceting; and
   etching back the first epitaxial layer to a smaller thickness than that of the first mask.

9. The method of claim 3, wherein the step of forming a plurality of second conductivity type wells comprises forming a second epitaxial layer in-situ doped with a second conductivity dopant.

10. The method of claim 9, wherein the doping concentration of the second conductivity dopant is in the range of about $1\times10^{17}/cm^3$ to about $1\times10^{20}/cm^3$.

11. The method of claim 9, further comprising:
forming the second epitaxial layer to a larger thickness than that of the first conductivity type wells to avoid corner faceting; and
planarizing the second epitaxial layer.

12. The method of claim 1, wherein step of forming a cap comprises thermal oxidation.

13. The method of claim 1, wherein the step of forming sidewall spacers comprises chemical vapor deposition.

14. The method of claim 1 wherein the sidewall spacers are made of nitride.

15. The method of claim 1, wherein the thickness of the sidewalls spacers is in the range of about 5 nm to about 30 nm.

16. The method of claim 1, wherein the first conductivity type is n-type and the second conductivity type is p-type.

17. The method of claim 1, further comprising:
etching the substrate between the plurality of openings in the first mask to a predetermined depth before forming a plurality of first conductivity type wells over the substrate.

18. The method of claim 17, further comprising:
forming a plurality of first conductivity type implant regions in the substrate before the step of forming sidewall spacers, each of the plurality of first conductivity type implant regions formed in a respective exposed surface of the substrate.

19. The method of claim 18, wherein the plurality of first conductivity type wells are formed by a first selective epitaxial growth process, and the plurality of second conductivity type wells are formed by a second selective epitaxial growth process over exposed surfaces of the first conductivity type implant regions.

20. The method of claim 17, wherein the predetermined depth is in the range of about 20 nm to about 500 nm.

21. The method of claim 18, wherein a doping concentration of the first conductivity type implant regions are in the range of about $1\times10^{19}/cm^3$ to about $1\times10^{21}/cm^3$.

22. The method of claim 18, wherein the plurality of first conductivity type implant regions are formed in the substrate to a depth of about 20 nm to about 600 nm.

23. The method of claim 19, wherein at least one of the plurality of first conductivity type wells is a dummy first conductivity well that terminates at least one second conductivity type well.

24. The method of claim 19, wherein at least one of the plurality of second conductivity type wells is a dummy second conductivity well that terminates at least one first conductivity type well.

25. The method of claim 19, wherein the first conductivity type is n-type and the second conductivity type is p-type.

* * * * *